: US 10,366,179 B2
(45) Date of Patent: Jul. 30, 2019

(54) COMPUTER-READABLE STORAGE MEDIUM AND INFORMATION PROCESSING DEVICE

(71) Applicant: FUJITSU LIMITED, Kawasaki-shi, Kanagawa (JP)

(72) Inventors: Hiroshi Tanaka, Atsugi (JP); Guoping Sun, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 29 days.

(21) Appl. No.: 15/631,494

(22) Filed: Jun. 23, 2017

(65) Prior Publication Data

US 2018/0011946 A1 Jan. 11, 2018

(30) Foreign Application Priority Data

Jul. 8, 2016 (JP) .................. 2016-136435

(51) Int. Cl.
| | |
|---|---|
| G06K 9/00 | (2006.01) |
| G06F 17/50 | (2006.01) |
| G06F 3/12 | (2006.01) |
| G06K 9/32 | (2006.01) |
| G06T 3/40 | (2006.01) |
| G06T 15/80 | (2011.01) |
| G06T 17/00 | (2006.01) |

(52) U.S. Cl.
CPC ............ G06F 17/50 (2013.01); G06F 3/1204 (2013.01); G06K 9/32 (2013.01); G06T 3/40 (2013.01); G06T 15/80 (2013.01); G06T 17/00 (2013.01)

(58) Field of Classification Search
CPC ....................................................... G06F 17/50
See application file for complete search history.

(56) References Cited

U.S. PATENT DOCUMENTS

| | | |
|---|---|---|
| 6,545,676 B1 | 4/2003 | Ryan et al. |
| 2005/0068317 A1 | 3/2005 | Amakai |
| 2005/0151734 A1* | 7/2005 | Gubkin .................. G06T 15/08 345/424 |

(Continued)

FOREIGN PATENT DOCUMENTS

| | | |
|---|---|---|
| DE | 10360150 A1 | 7/2005 |
| JP | 2006-277672 | 10/2006 |

(Continued)

OTHER PUBLICATIONS

Extended European Search Report dated Jan. 16, 2018 for corresponding European Patent Application No. 17178061.2, 8 pages.

(Continued)

*Primary Examiner* — Oneal R Mistry
(74) *Attorney, Agent, or Firm* — Fujitsu Patent Center

(57) ABSTRACT

A computer readable storage medium stores a facetization processing program that causes a computer to execute a process. The process includes: voxelizing a three-dimensional shape; generating first voxels corresponding to the three-dimensional shape; specifying an area surrounded by the generated first voxels; setting the specified area as voxels to generate second voxels; and facetizing third voxels at a boundary between at least one of the first voxels and a non-voxel area, and the second voxels and the non-voxel area.

4 Claims, 14 Drawing Sheets

(56) References Cited

U.S. PATENT DOCUMENTS

| | | | |
|---|---|---|---|
| 2006/0066611 A1* | 3/2006 | Fujiwara | G06T 15/06 345/419 |
| 2009/0109220 A1* | 4/2009 | Tomson | G06T 15/506 345/424 |
| 2011/0205583 A1* | 8/2011 | Young | B29C 67/0088 358/1.15 |
| 2014/0146047 A1 | 5/2014 | Wu et al. | |
| 2017/0178388 A1* | 6/2017 | Bisson | G06T 17/00 |

FOREIGN PATENT DOCUMENTS

| | | |
|---|---|---|
| JP | 2013-011579 | 1/2013 |
| JP | 2015-035097 | 2/2015 |
| KR | 10-2005-0010982 A | 1/2005 |

OTHER PUBLICATIONS

Nooruddin, Fakir S. et al., "Simplification and Repair of Polygonal Models Using Volumetric Techniques", IEEE Transactions on Visualization and Computer Graphics, vol. 9, No. 2, Apr.-Jun. 2003, pp. 191-205, XP055069494.

Korean Office Action dated May 24, 2018 for corresponding Korean Patent Application No. 10-2017-0082431, with English Abstract, 12 pages.

European Office Action dated May 28, 2019 for corresponding European Patent Application No. 17178061.2, 8 pages.

\* cited by examiner

FIG.4
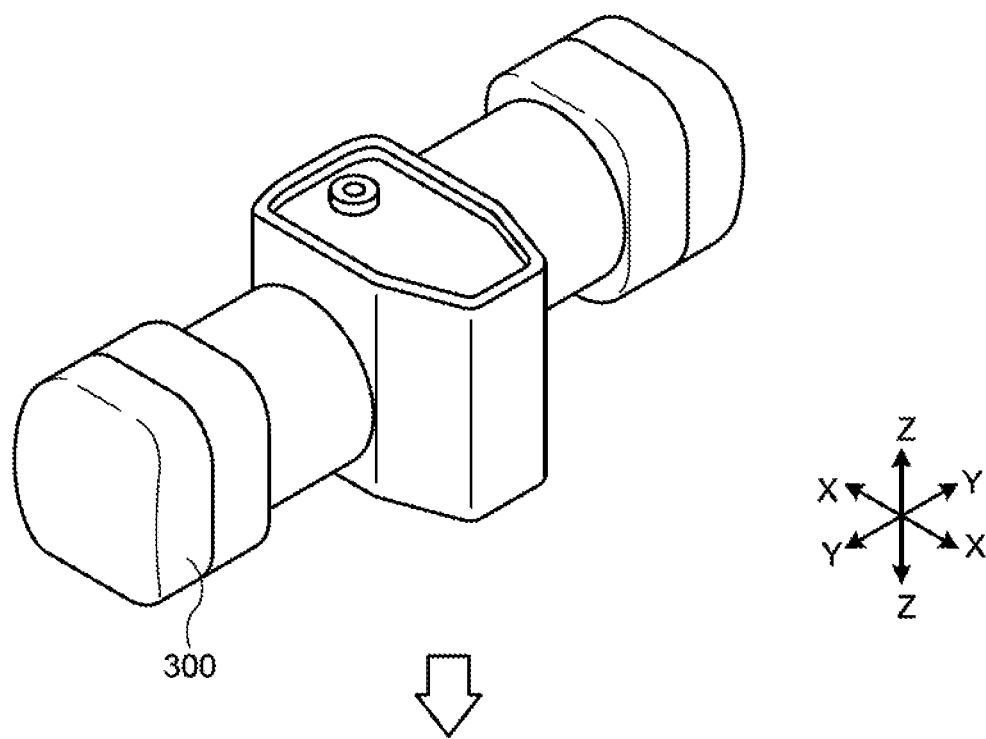
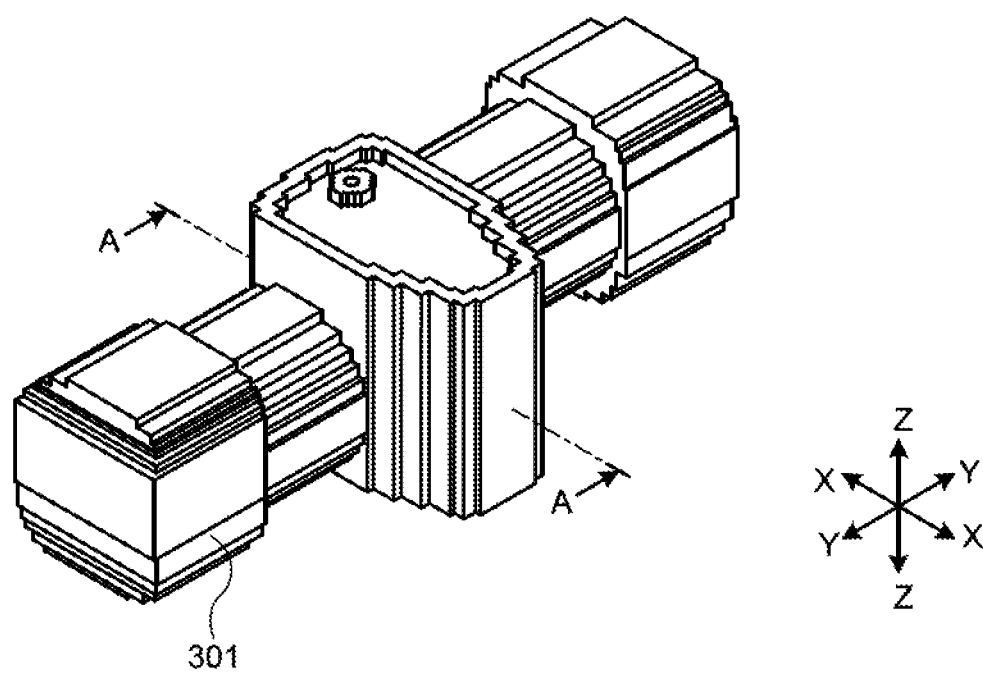

FIG.10
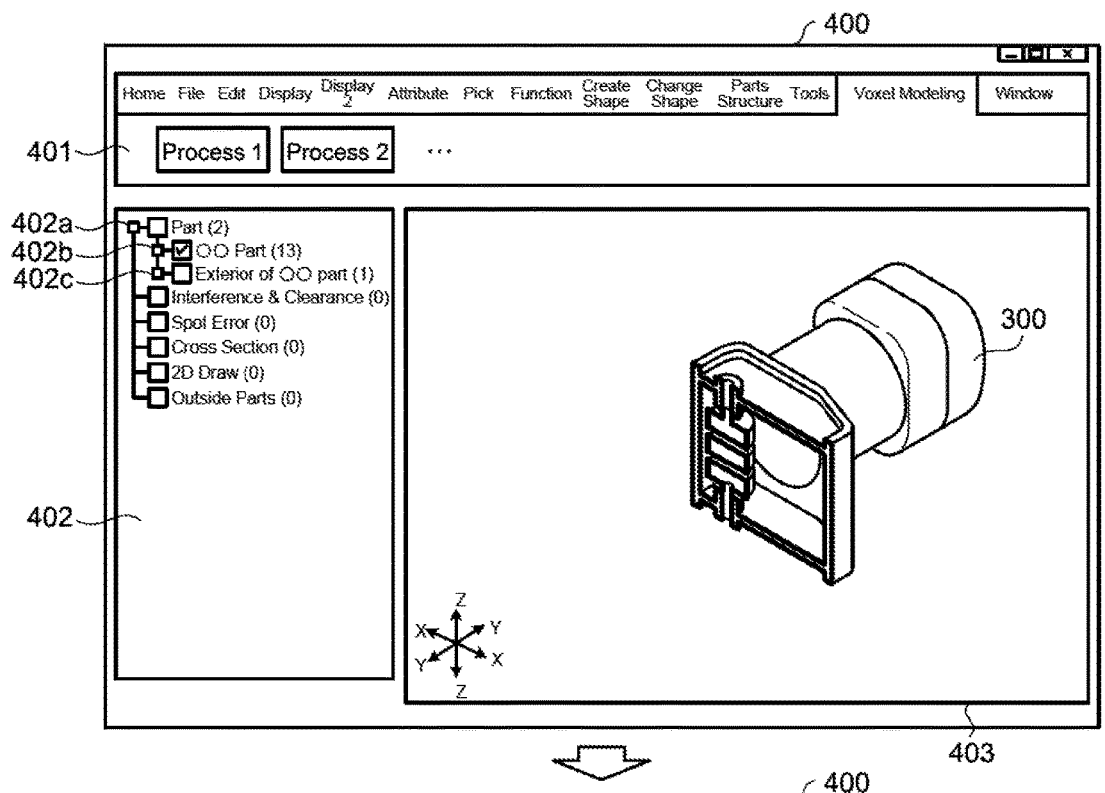
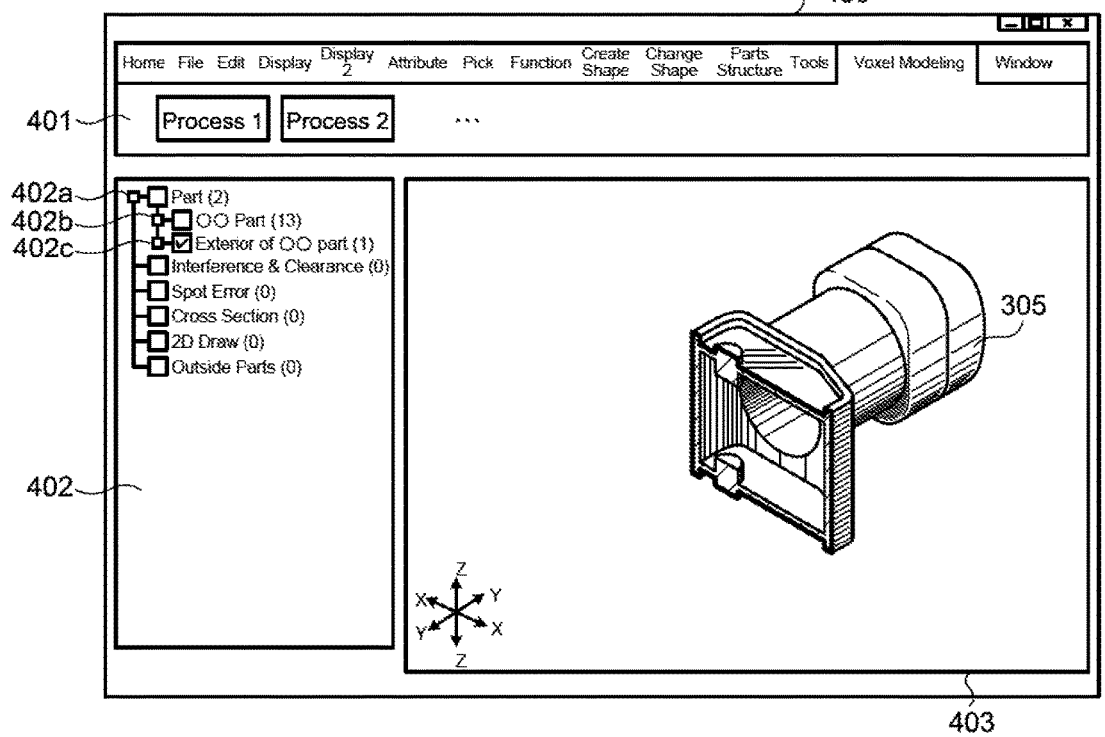

COMPUTER-READABLE STORAGE MEDIUM AND INFORMATION PROCESSING DEVICE

CROSS-REFERENCE TO RELATED APPLICATION

This application is based upon and claims the benefit of priority of the prior Japanese Patent Application No. 2016-136435, filed on Jul. 8, 2016, the entire contents of which are incorporated herein by reference.

FIELD

The embodiments discussed herein are related to a facetization processing program, a facet extracting program, a facetization processing method, a facet extracting method, and an information processing device.

BACKGROUND

Computer Aided Engineering (CAE) is known as an example of technology to support prior examination of product design, manufacturing, and process design by utilizing computer technology. In the CAE field, by performing simulation based on shape data of three-dimensional shape of a product such as an automobile as a target to be designed, it is possible to verify the assembly process, etc. from the design stage of the target product.

Patent Literature 1: Japanese Laid-open Patent Publication No. 2006-277672

SUMMARY

According to an aspect of an embodiment, a computer readable storage medium stores a facetization processing program that causes a computer to execute a process. The process includes: voxelizing a three-dimensional shape; generating first voxels corresponding to the three-dimensional shape; specifying an area surrounded by the generated first voxels; setting the specified area as voxels to generate second voxels; and facetizing third voxels at a boundary between at least one of the first voxels and a non-voxel area, and the second voxels and the non-voxel area.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is an explanatory diagram for explaining voxelization of a three-dimensional shape;

FIG. 10 is an explanatory diagram for explaining a display screen;

DESCRIPTION OF EMBODIMENTS

Preferred embodiments of the present invention will be explained with reference to accompanying drawings. In the embodiments, the same reference signs are assigned to components having the same functions and redundant explanation is omitted. The facetization processing program, the facet extracting program, the facetization processing method, the facet extracting method, and the information processing device explained in the following embodiments are only one examples, and are not limited to the embodiments. In addition, the embodiments as follows may be appropriately combined with each other within a range in which no contradiction arises.

In the above conventional technology, there is a case in which a processing load increases when extracting an exterior of the product as a target to be designed from the shape data of the three-dimensional shape.

For example, in manufacturing places of automobiles, etc., there is a case where manufacture of a product to be incorporated in the exterior of a product is consigned to other company. In such a case where the product is consigned to other company, the data indicating the shape of the exterior of the product is extracted and provided. However, in the product such as an automobile, because the size of a surface element indicating the three-dimensional shape of the product is fine and the number of elements is increased, a large processing load is applied to extract the data indicating the shape of the exterior.

Accordingly, it is an object in one aspect of an embodiment to provide a facetization processing program, a facet extracting program, a facetization processing method, a facet extracting method, and an information processing device capable of easily extracting an exterior from a three-dimensional shape.

Figure 1:
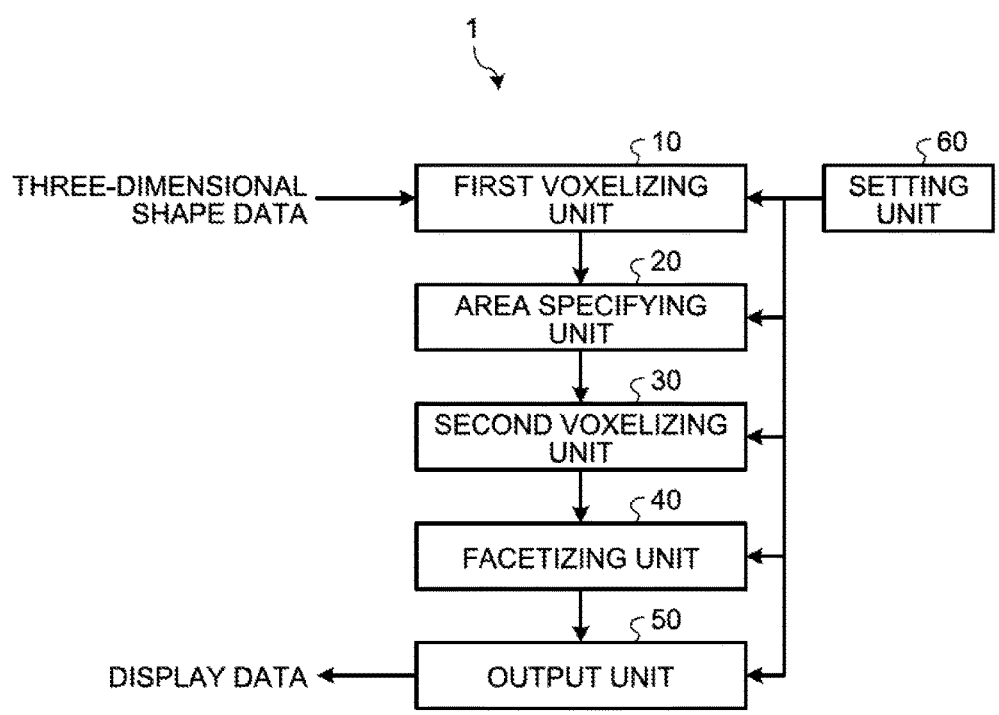
FIG. 1 is a block diagram illustrating an example of a functional configuration of an information processing device according to an embodiment.

FIG. 1 is a block diagram illustrating an example of a functional configuration of the information processing device according to the embodiment. As an information processing device 1 illustrated in FIG. 1, for example, a personal computer (PC) can be applied. The information processing device 1 accepts, for example, three-dimensional shape data of a product created by three-dimensional Computer Aided Design (CAD) on a computer. The information processing device 1 then performs processing such as extraction of the exterior of the product based on the accepted three-dimensional shape data, and outputs the processing result to a display or the like.

Here, the three-dimensional shape data is data indicating shapes of components that constitute the product, and Boundary REPresentation (BREP), facets or the like can be applied. The BREP expresses a three-dimensional shape of a product with phase information (Body, Face, Loop, CoEdge, Edge, Vertex, etc.) and geometric information (Base Surface, Base Curve, Base Point, etc.). The facets express a three-dimensional shape of a product with a collection of micro triangles (Body, Face, Triangles, etc.).

A first voxelizing unit 10 voxelizes a three-dimensional shape of a product indicated by the three-dimensional shape data of the product to generate voxels (first voxels) corresponding to the three-dimensional shape.

The voxels express a three-dimensional shape with a collection of micro cubes (lattices) in XYZ space. In this way, because the voxels can simply express the three-dimensional shape by presence or absence of micro cubes in the XYZ space, it is possible to suppress the processing load applied to various computations as compared with the three-dimensional shape data such as the BREP and the facets.

An area specifying unit 20 specifies an area surrounded by the first voxels generated by the first voxelizing unit 10. A second voxelizing unit 30 sets the area specified by the area specifying unit 20 as voxels and generates the voxels (second voxels).

A facetizing unit 40 facetizes a boundary between the first voxels generated by the first voxelizing unit 10 and the second voxels generated by the second voxelizing unit 30 and a non-voxel area, that is, facetizes an exterior portion of the three-dimensional shape indicated by the voxels.

Specifically, the facetizing unit 40 facetizes voxels at a boundary between the first and the second voxels and the non-voxel area. The facetizing unit 40 may facetize an exterior portion of the three-dimensional shape by extracting facets corresponding to the boundary between the first and the second voxels and the non-voxel area from the facets included in the three-dimensional shape data.

An output unit 50 outputs the result of the processing after the facetization by the facetizing unit 40, that is, the facets indicating the shape of the exterior portion of the three-dimensional shape. As an example, the output unit 50 outputs the display data for displaying the exterior portion of the three-dimensional shape based on the facets. As a result, a user can check the shape of the exterior portion of the product indicated by the three-dimensional shape data.

A setting unit 60 is a user interface that accepts various settings from the user. For example, the setting unit 60 performs various settings by displaying a graphical user interface (GUI) on the display and accepting an operation from the user through the GUI. As an example, the setting unit 60 accepts condition settings for extracting the exterior by the voxels in the first voxelizing unit 10, the area specifying unit 20, the second voxelizing unit 30, and the facetizing unit 40. The setting unit 60 also accepts display settings such as setting for the display data to be output in the output unit 50.

Figure 2:
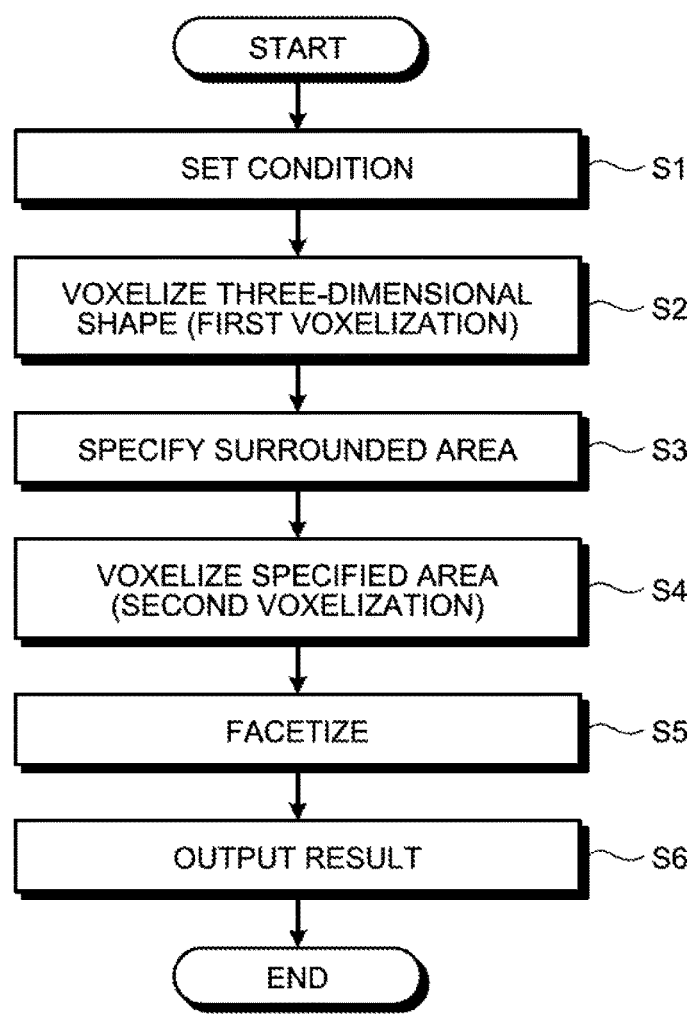
FIG. 2 is a flowchart illustrating an example of an operation of the information processing device according to the embodiment.

Details of the processing in the information processing device 1 will be explained next. FIG. 2 is flowchart illustrating an example of an operation of the information processing device 1 according to the embodiment.

As illustrated in FIG. 2, when the process is started, the setting unit 60 sets conditions for extracting the exterior by the voxels based on the operation of the user on the setting screen (S1).

Figure 3:
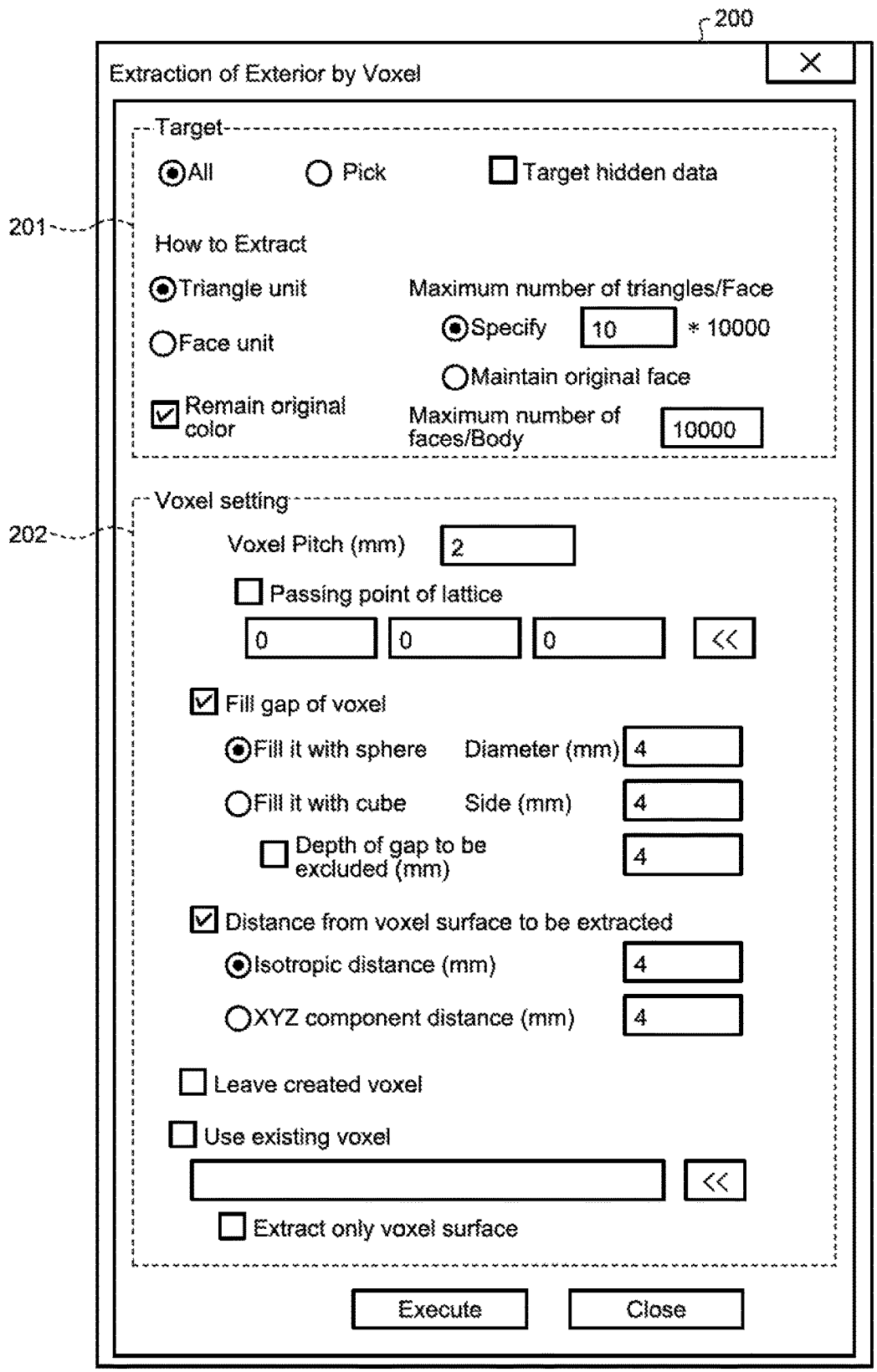
FIG. 3 is an explanatory diagram for explaining a setting screen.

FIG. 3 is an explanatory diagram for explaining a setting screen. As illustrated in FIG. 3, a setting screen 200 has setting areas 201 and 202.

The setting area 201 accepts condition settings such as an extracting method for an exterior portion of the three-dimensional shape. Specifically, the setting area 201 accepts condition settings such as an extracting method for facetizing voxels at a boundary between the first and the second voxels and the non-voxel area or an extracting method for extracting the facets corresponding to the boundary.

The setting area 202 accepts condition settings for performing voxelization in the first voxelizing unit 10, the area specifying unit 20, or the like. Specifically, the setting area 202 accepts the condition settings such as a pitch of voxelization, a size (details thereof are explained later) of a sphere (or a cube) when performing a process for filling a gap.

Following S1, the first voxelizing unit 10 voxelizes (first voxelization) the three-dimensional shape of the product indicated by the three-dimensional shape data of the product under the condition set at S1 (S2).

FIG. 4 is an explanatory diagram for explaining voxelization of a three-dimensional shape. As illustrated in FIG. 4, the first voxelizing unit 10 voxelizes a three-dimensional shape 300 indicated by the three-dimensional shape data to generate voxels 301 corresponding to the three-dimensional shape 300. This voxelization is performed by using, for example, a known algorithm such as setting an area, through which each triangle of the facets included in the three-dimensional shape data passes, to "1 (with a voxel)".

Then, the area specifying unit 20 specifies an area surrounded by the voxels 301 generated by the first voxelizing unit 10 (S3). The second voxelizing unit 30 sets the specified area as voxels to perform voxelization (second voxelization) (S4). The second voxelizing unit 30 fills an inner area surrounded by the voxels 301 with the voxels by the processes at S3 and S4.

Figure 5:
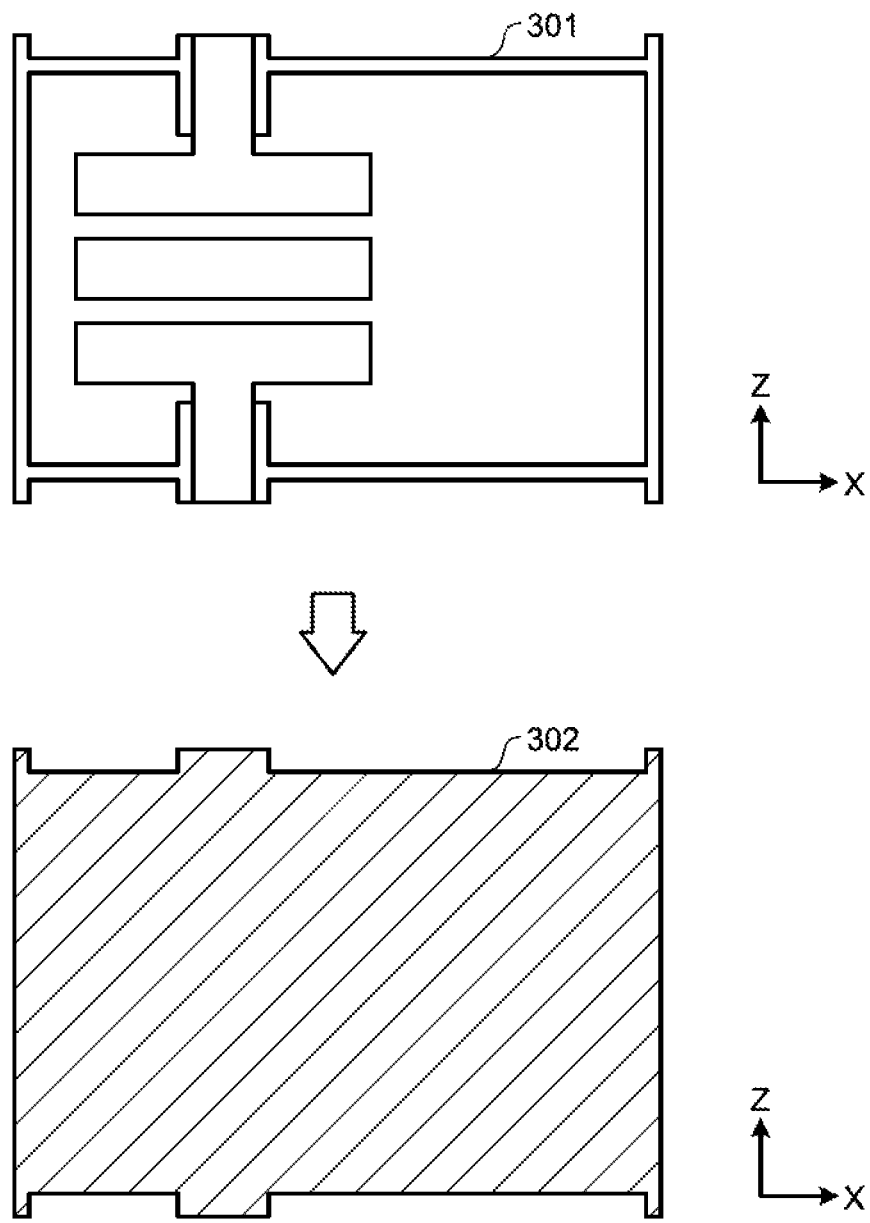
FIG. 5 is an explanatory diagram for explaining the process of filling a surrounded area.

FIG. 5 is an explanatory diagram for explaining the processes (S3 and S4) of filling the surrounded area. Specifically, FIG. 5 represents a cross section of the voxels 301 in FIG. 4 in an A-A direction.

As illustrated in FIG. 5, the area specifying unit 20 specifies the area surrounded by the voxels 301 from the arrangement of the voxels 301 in the XYZ space. Then, the second voxelizing unit 30 voxelizes the inside of the area surrounded by the voxels 301 and fills the area with the voxels to obtain the voxels 302.

The area specifying unit 20 may specify an area surrounded by the voxels 301 including an area in which a sphere or a cube of a certain size continuously passes over the voxels 301. Thus, the area specifying unit 20 can fill a gap (a part where voxels are missing) in the voxels 301.

Figure 6:
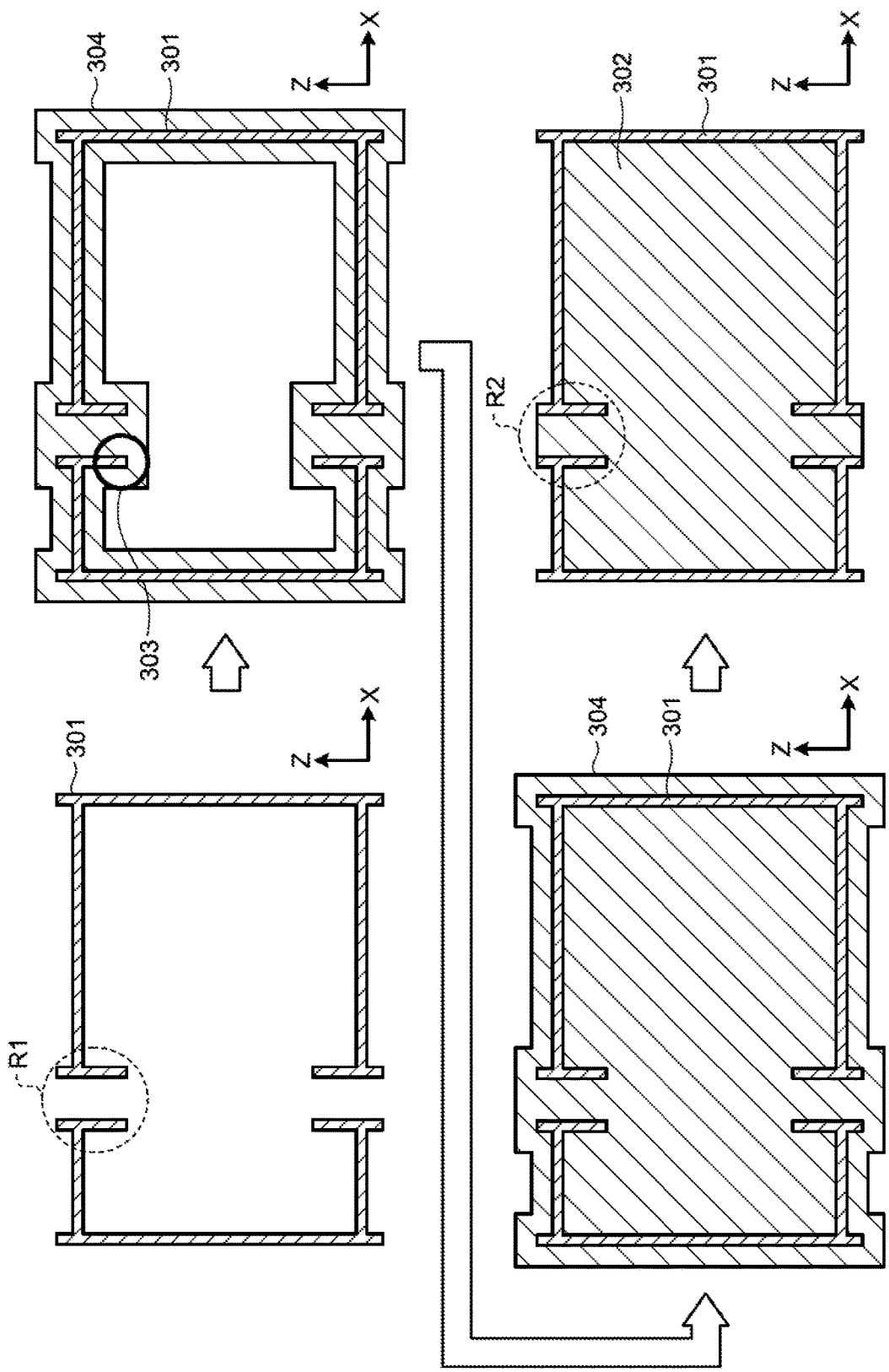
FIG. 6 is an explanatory diagram for explaining the process of filling a gap.

FIG. 6 is an explanatory diagram for explaining the process of filling a gap. As illustrated in FIG. 6, it is assumed that the voxels 301 have a gap at a region R1. The area specifying unit 20 continuously moves a sphere 303 of the size set with S1 or the like along the voxels 301. As a result, the area specifying unit 20 obtains an extended area 304 in which the sphere 303 continuously passes over the voxels 301. Because the gap in the voxels 301 at the region R1 is filled with the extended area 304, the area specifying unit 20 can specify the area surrounded by the voxels 301 even if there is a gap in the voxels 301.

In addition, the area specifying unit 20 deletes an area corresponding to a portion extended from the voxels 301 in the outer circumferential direction, from the extended area 304, that is, deletes an area protruding outside the voxels 301. Specifically, the area specifying unit 20 deletes an area that protrudes outside the voxels 301 by the radius of the sphere 303. Accordingly, as illustrated in a region R2 corresponding to the region R1, the extra area protruding outside can be deleted with the gap filled.

Following S4, the facetizing unit 40 facetizes a boundary between the voxels 301 generated by the first voxelizing unit 10 and the voxels 302 generated by the second voxelizing unit 30, and the non-voxel area, that is, facetizes an exterior portion of the three-dimensional shape indicated by the voxels (S5).

Figure 7:
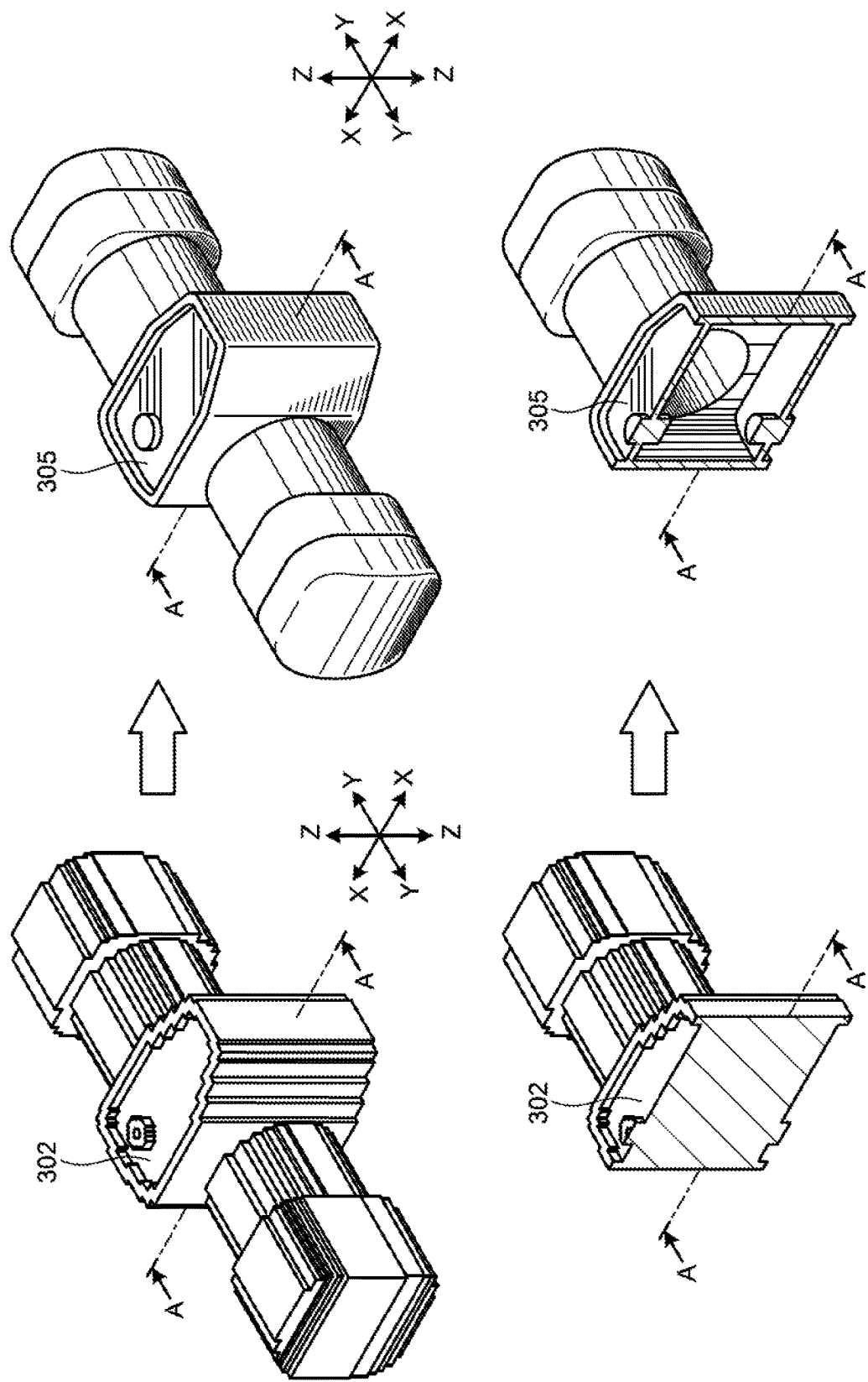
FIG. 7 is an explanatory diagram for explaining facetization.
Figure 8:
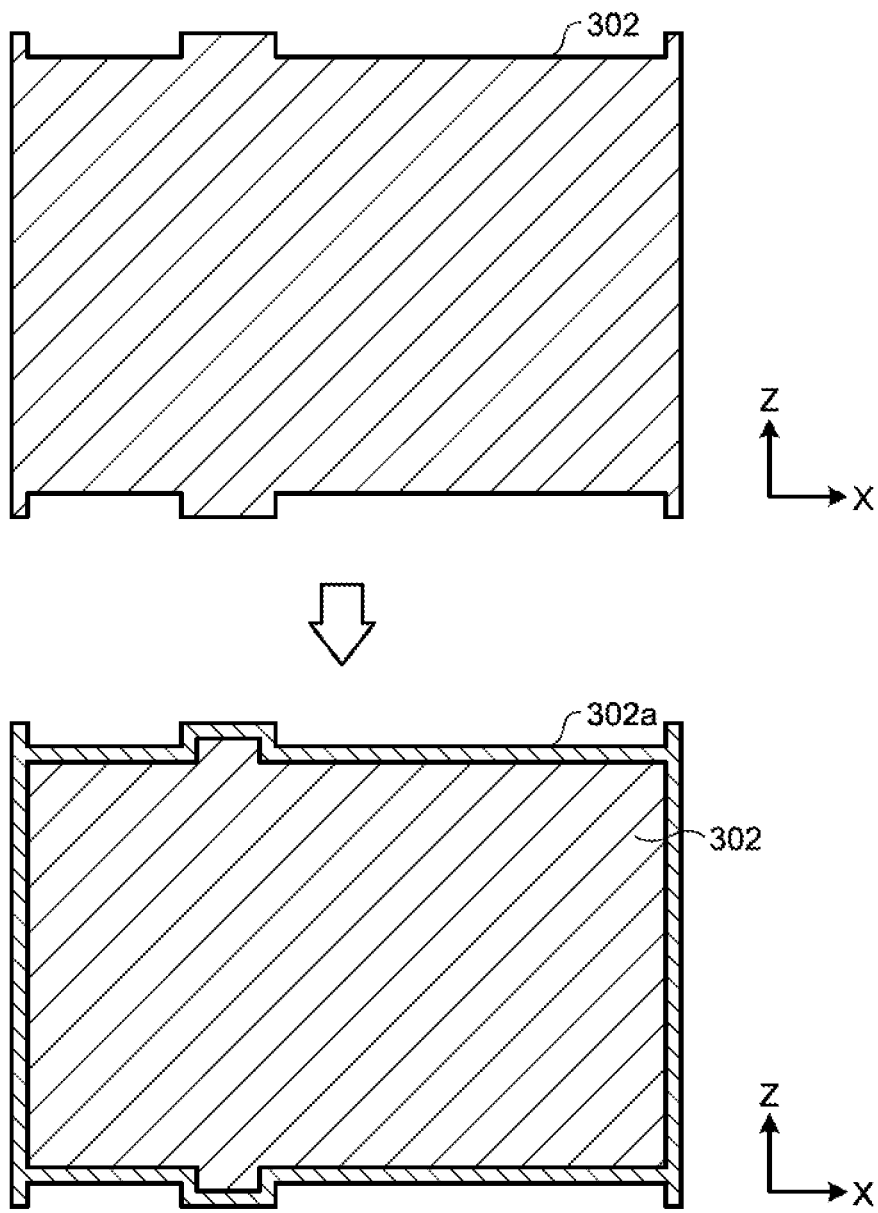
FIG. 8 is an explanatory diagram for explaining facetization.

FIG. 7 and FIG. 8 are explanatory diagrams for explaining facetization. As illustrated in FIG. 7, the facetizing unit 40 specifies coordinates of XYZ space on the boundary between the voxels 301 and 302 and the non-voxel area. The facetizing unit 40 then refers to the facets included in the three-dimensional shape data based on the coordinates of the specified XYZ space to extract a facet corresponding to the coordinates of the specified XYZ space. Moreover, when the three-dimensional shape data has the phase/geometric information (BREP), the facetizing unit 40 may also extract the phase/geometric information (BREP) which is a generator of the extracted facets.

As illustrated in FIG. 8, the facetizing unit 40 specifies boundary voxels 302a at the boundary between the voxels 301 and 302 and the non-voxel area. The facetizing unit 40 may then perform facetization by generating facets from the boundary voxels 302a.

As an example, by using a known method such as Marching Cubes, the facetizing unit 40 performs facetization from the boundary voxels 302a. However, surface smoothness (smoothing) may be lost in the case of facetization based on the boundary voxels 302a. Therefore, the facetizing unit 40 may perform known smoothing processing such as $\lambda\mu$ smoothing on the facets generated by the Marching Cubes method or the like.

Following S5, the output unit 50 outputs the processing result of facetization at S5 (S6). Specifically, the output unit 50 outputs the facets indicating the exterior portion of the three-dimensional shape to the display screen or the like.

Figure 9:
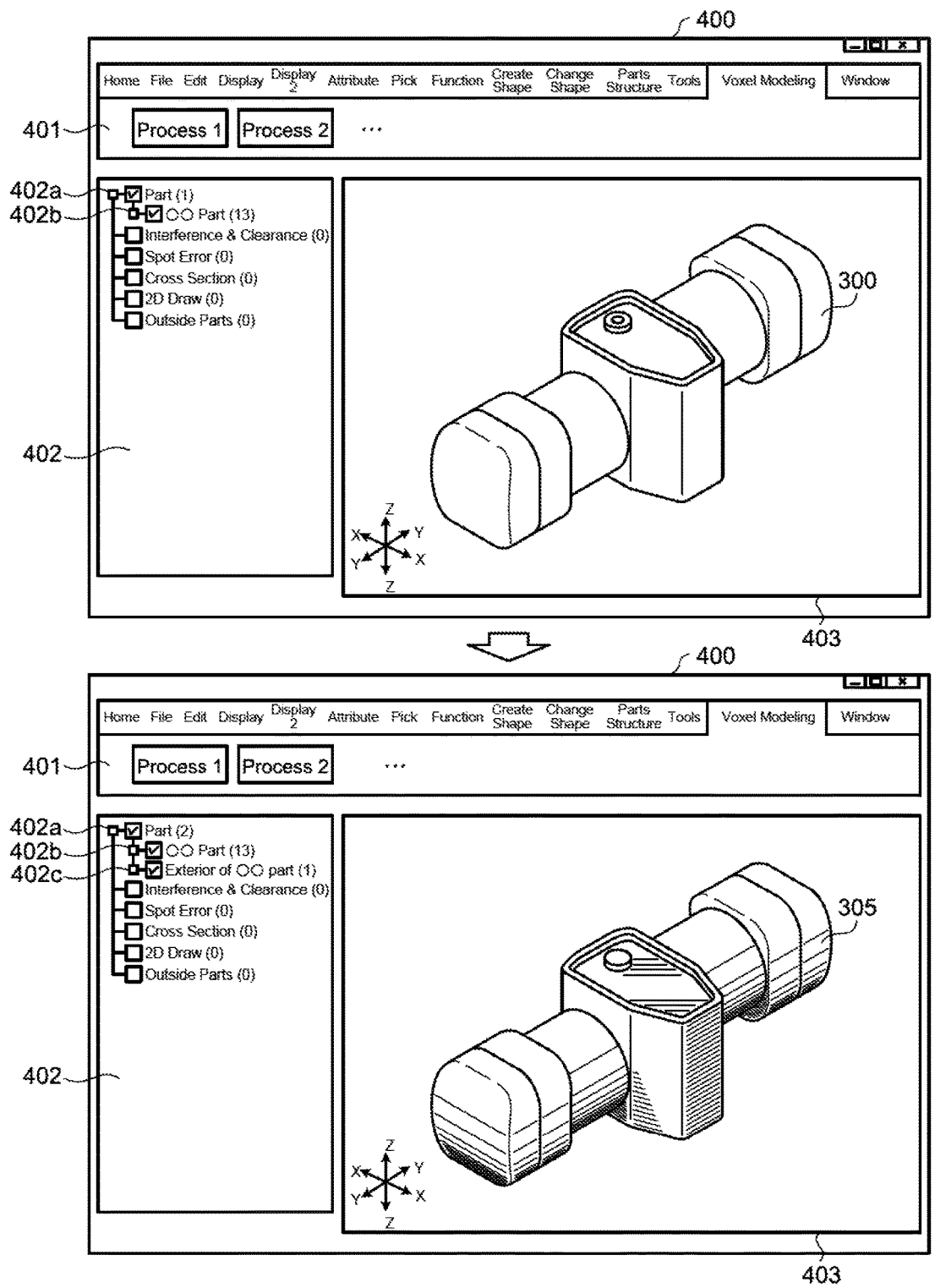
FIG. 9 is an explanatory diagram for explaining a display screen.

FIG. 9 and FIG. 10 are explanatory diagrams for explaining a display screen. It is to be noted that FIG. 10 is display examples of the cross sectional shape of the three-dimensional shape 300 and facets 305 in FIG. 9. As illustrated in FIG. 9, a display screen 400 includes an operation area 401, a tree display area 402, and a three-dimensional shape display area 403.

The operation area 401 is an area having various operation buttons, and accepts an operation instruction from the user. The tree display area 402 is an area for displaying a display member displayed in the three-dimensional shape display area 403 in a tree form. Branches 402b and 402c are set in a tree 402a of the tree display area 402 for each display member displayed in the three-dimensional shape display area 403. By checking on/off checkboxes in the branches 402b and 402c, the user can instruct whether or not to display the display members in the three-dimensional shape display area 403.

At S6, the facets 305 indicating the exterior portion of the three-dimensional shape are displayed in the three-dimensional shape display area 403. As a result, the user can confirm the exterior portion of the three-dimensional shape with the facets 305. Moreover, by checking on/off checkboxes in the branches 402b and 402c of the tree 402a in the tree display area 402, the user can switch the display between the three-dimensional shape 300 and the facets 305.

Specifically, as illustrated in FIG. 10, by checking on the checkbox of the branch 402c and checking off the checkbox of the branch 402b, it is possible to delete the three-dimensional shape 300 and to display the facets 305.

Although FIG. 9 and FIG. 10 represent the examples of displaying the facets 305 directly from the three-dimensional shape 300, the information processing device 1 may display the facets 305 facetized after displaying the display screen for checking voxelization of the three-dimensional shape 300.

Figure 11A:
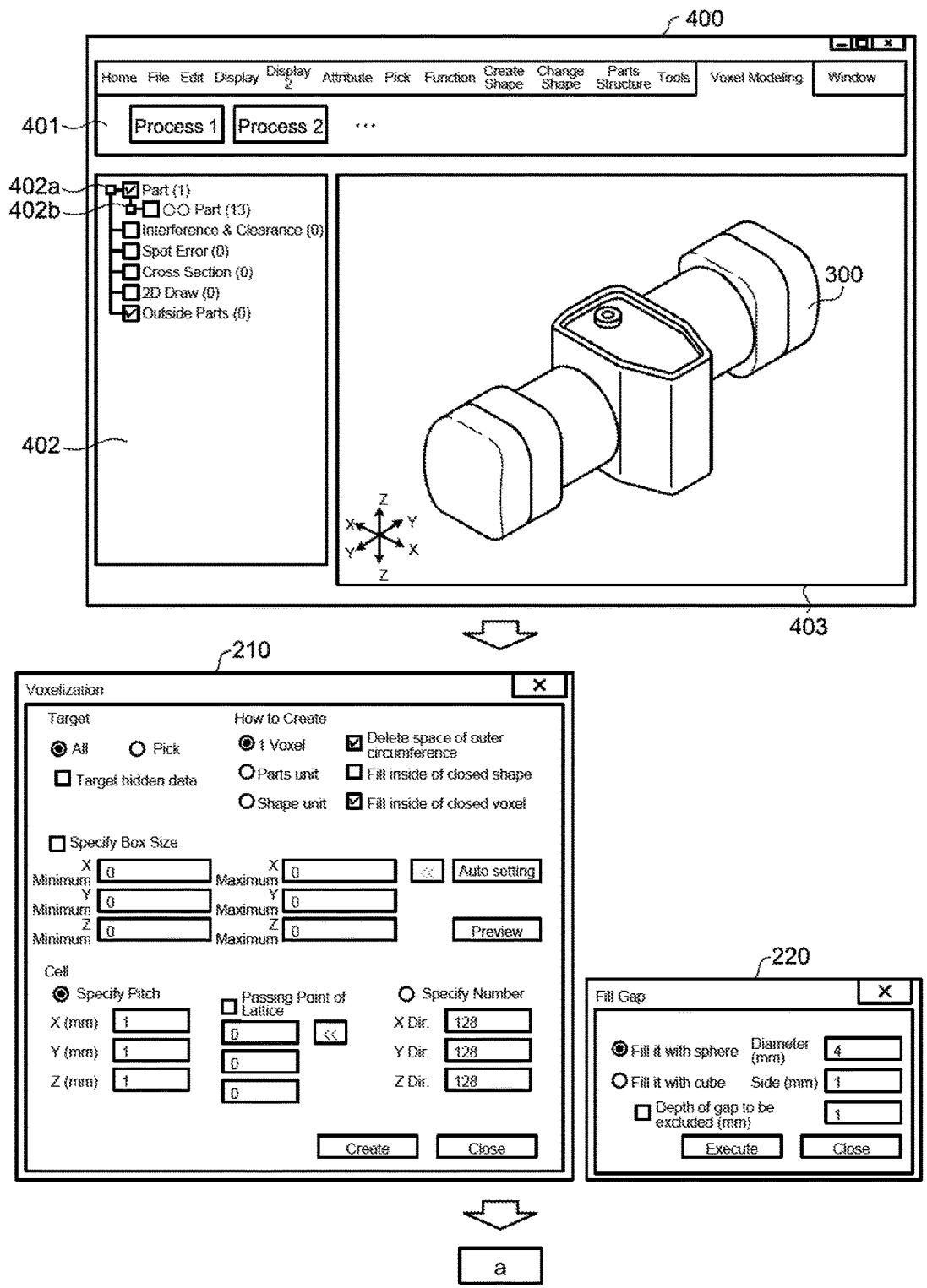
FIG. 11A is an explanatory diagram for explaining a display screen when facetization is performed after voxelization.
Figure 11B:
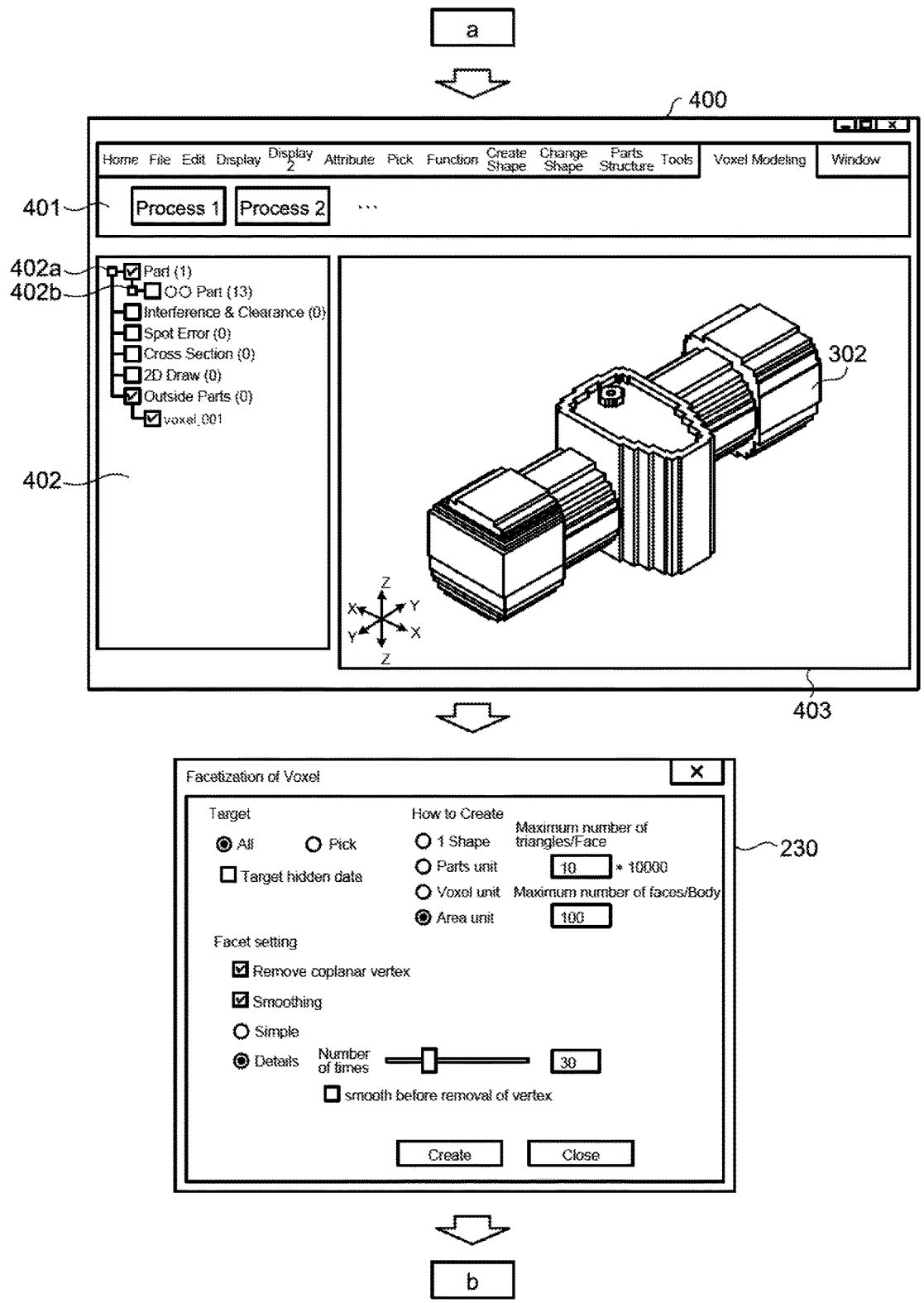
FIG. 11B is an explanatory diagram for explaining a display screen when facetization is performed after voxelization.
Figure 11C:
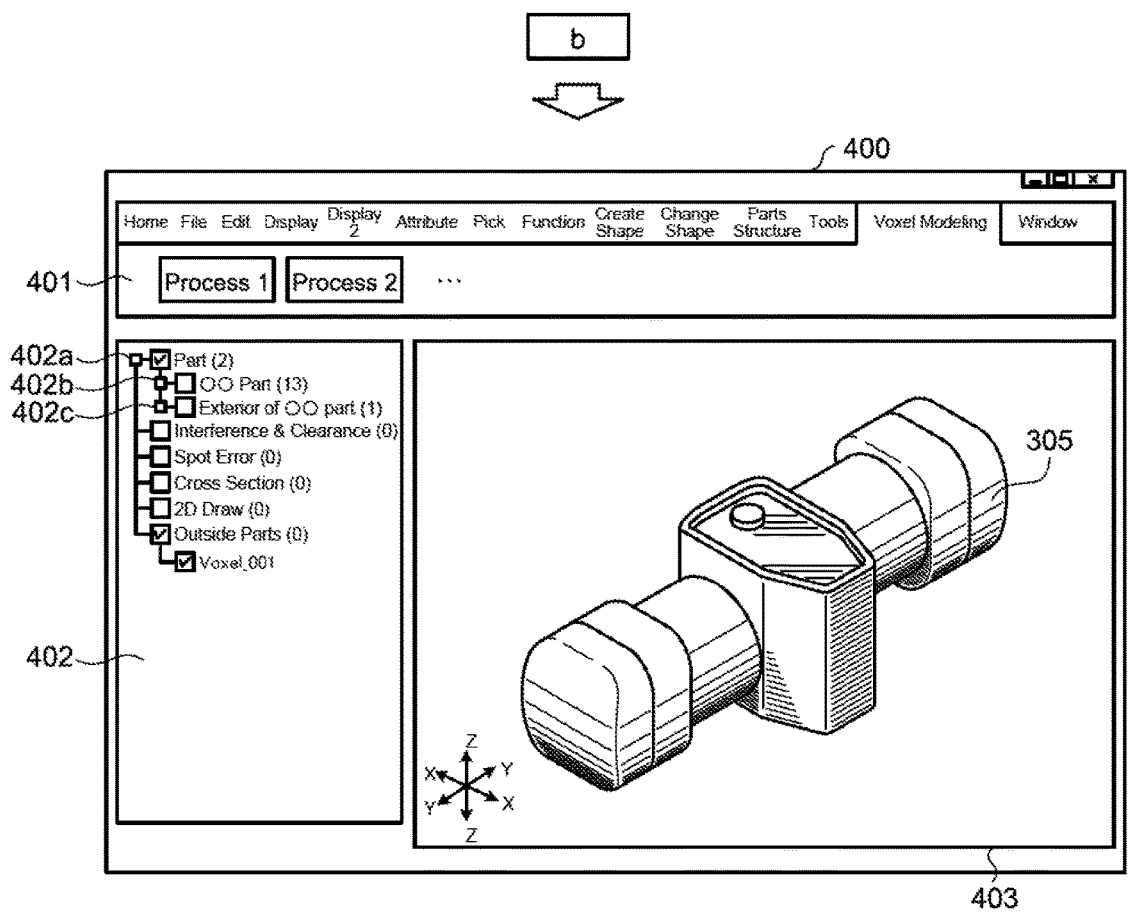
FIG. 11C is an explanatory diagram for explaining a display screen when facetization is performed after voxelization.

FIG. 11A to FIG. 11C are explanatory diagrams for explaining a display screen when facetization is performed after voxelization. As illustrated in FIG. 11A, the user first performs setting of voxelization by performing operation on the operation area 401 through the display screen 400 which displays the three-dimensional shape 300 in the three-dimensional shape display area 403. Specifically, the user invokes the setting screens 210 and 220, performs condition settings of the voxelization in the first voxelizing unit 10, the area specifying unit 20, and the second voxelizing unit 30, and executes voxelization of the three-dimensional shape 300.

Thus, the voxelization is performed on the three-dimensional shape 300, and, as illustrated in FIG. 11B, the voxels 302 corresponding to the three-dimensional shape 300 are displayed in the three-dimensional shape display area 403. Therefore, the user can confirm the state of the voxels 302 corresponding to the three-dimensional shape 300. The user then invokes a setting screen 230, performs condition settings of facetization in the facetizing unit 40, and executes facetization of the voxels 302.

Accordingly, the facetization is performed on the boundary of the voxels 302, and, as illustrated in FIG. 11C, the facets 305 corresponding to the three-dimensional shape 300 is displayed in the three-dimensional shape display area 403. Therefore, the user can confirm the facets 305 corresponding to the three-dimensional shape 300. In this way, the configuration where the facets 305 are obtained while the user checks each step from the voxelization to the facetization may be adopted.

As explained above, the information processing device 1 voxelizes the three-dimensional shape 300, generates the voxels 301 corresponding to the three-dimensional shape 300, and specifies the area surrounded by the voxels 301. Then, the information processing device 1 sets the specified area as the voxels to generate the voxels 302, and facetizes the boundary voxels 302a at the boundary between the voxels 301 and 302 and the non-voxel area. Alternatively, the information processing device 1 extracts facets corresponding to the boundary between the voxels including the voxels 301 and 302 and the non-voxel area, from the facets that express the three-dimensional shape 300. In this way, because the information processing device 1 extracts the exterior of the three-dimensional shape using the voxels 301 and 302 that can simply express the three-dimensional shape, it is possible to suppress the processing load applied to the various computations as compared with the three-dimensional shape data such as the BREP or the facets.

In addition, the components of the illustrated devices are not necessarily physically configured as illustrated. In other words, the specific mode of distribution and integration of the devices is not limited to the illustrated ones, and all or part of the devices can be configured to be distributed or integrated functionally or physically in arbitrary units according to various loads and usage conditions.

All or arbitrary part of the various processing functions performed by the information processing device 1 may be executed on a central processing unit (CPU) (or on a microcomputer such as a micro processing unit (MPU) or a micro controller unit (MCU)). In addition, it is needless to say that all or arbitrary part of the various processing functions may be executed on the program analyzed and executed by the CPU (or by the microcomputer such as MPU or MCU) or on the hardware by wired logic. The various processing functions performed by the information processing device 1 may be executed in cooperation with a plurality of computers by cloud computing.

Figure 12:
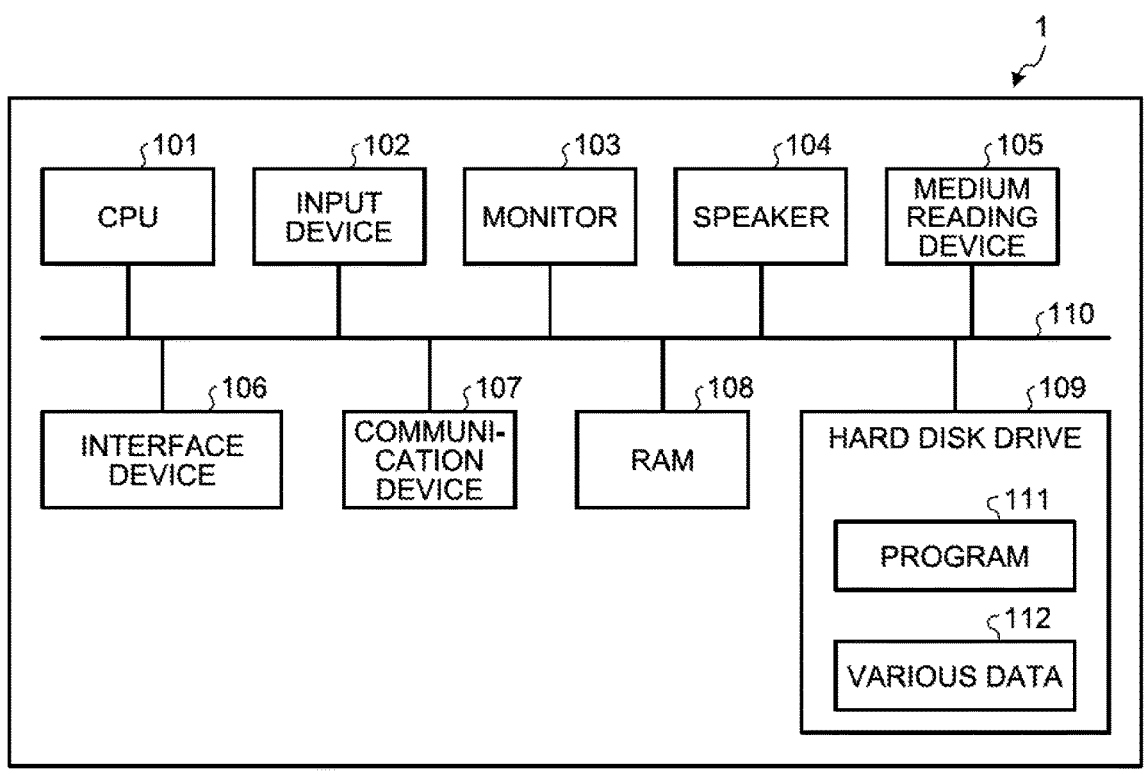
FIG. 12 is a block diagram illustrating an example of a hardware configuration of the information processing device according to the embodiment.

Incidentally, the various types of processing explained in the embodiment can be implemented by a computer executing a prepared program. Therefore, an example of the computer (hardware) that executes the program having the same functions as these of the embodiment will be explained below. FIG. 12 is a block diagram illustrating an example of a hardware configuration of the information processing device 1 according to the embodiment.

As illustrated in FIG. 12, the information processing device 1 includes a CPU 101 that executes various arithmetic processing, an input device 102 that accepts a data input, a monitor 103, and a speaker 104. The information processing device 1 also includes a medium reading device 105 that reads a program or the like from a storage medium, an interface device 106 for connecting to the various devices, and a communication device 107 for communicating with an external device by wired or wireless connection. The information processing device 1 further includes random access memory (RAM) 108 that temporarily stores various pieces of information and a hard disk drive 109. The units (101 to 109) of the information processing device 1 are connected to a bus 110.

The hard disk drive 109 stores a program 111 for executing various processing in the first voxelizing unit 10, the area specifying unit 20, the second voxelizing unit 30, the facetizing unit 40, the output unit 50, and the setting unit 60 explained in the embodiment. Moreover, the hard disk drive 109 stores various data 112 (e.g., three-dimensional shape data) referenced by the program 111. The input device 102 accepts, for example, an input of operation information from an operator of the information processing device 1. The monitor 103 displays, for example, various screens (e.g., the setting screen 200 and the display screen 400) operated by the operator. The interface device 106 is connected with, for example, a printing device. The communication device 107 is connected to a communication network such as a local area network (LAN), and exchanges various information with an external device via the communication network.

The CPU 101 performs various processing by reading the program 111 stored in the hard disk drive 109, loading the read program into the RAM 108, and executing the program. The program 111 does not have to be stored in the hard disk drive 109. For example, the program 111 stored in a storage medium readable by the information processing device 1 may be read and executed. The storage medium readable by the information processing device 1 corresponds to, for example, a portable recording medium such as a compact disk read only memory (CD-ROM), a digital versatile disk (DVD), and Universal Serial Bus (USB) memory, a semiconductor memory such as a flash memory, and a hard disk drive. The configured where the program 111 is stored in a device connected to a public line, the Internet, or LAN, etc. and the information processing device 1 reads the program 111 from any of the devices and executes the program may be adopted.

According to an embodiment, it is possible to easily extract the exterior from the three-dimensional shape.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable storage medium storing a facet extracting program that causes a computer to execute a process for extracting an exterior of a product based on three-dimensional shape data of the product, the three-dimensional shape data being created by a three-dimensional CAD (Computer Aided Design) and received by the computer, the process comprising:
   voxelizing the three-dimensional shape data to generate first voxels corresponding thereto;
   specifying an area surrounded by the generated first voxels, the area including an area in which a sphere or a cube of a certain size continuously passes over the first voxels;
   setting the specified area as second voxels; and
   extracting facets and phase/geometric information that are included in the three-dimensional shape data and correspond to a boundary between voxels including the first voxels and the second voxels and a non-voxel area, the extracted facets and phase/geometric information corresponding to the exterior.

2. The non-transitory computer-readable storage medium according to claim 1, wherein the specifying the area includes deleting an area corresponding to a portion extended from the first voxels in an outer circumferential direction, from the area in which the sphere or the cube of the certain size passes.

3. An information processing device for extracting an exterior of a product based on three-dimensional shape data of the product, the three-dimensional shape data being created by a three-dimensional CAD (Computer Aided Design) and received thereby, the information processing device comprising:
   a memory; and
   a processor coupled to the memory and configured to:
      voxelize the three-dimensional shape data to generate first voxels corresponding thereto,
      specify an area surrounded by the generated first voxels, the area including an area in which a sphere or a cube of a certain size continuously passes over the first voxels,
      set the specified area as second voxels, and
      extracting facets and phase/geometric information that are included in the three-dimensional shape data and correspond to a boundary between voxels including the first voxels and the second voxels and a non-voxel area, the extracted facets and phase/geometric information corresponding to the exterior.

4. The information processing device according to claim 3, wherein the processor is configured to delete an area corresponding to a portion extended from the first voxels in an outer circumferential direction, from the area in which the sphere or the cube of the certain size passes.

\* \* \* \* \*